(12) United States Patent
Kikuchi et al.

(10) Patent No.: US 7,652,307 B2
(45) Date of Patent: Jan. 26, 2010

(54) SEMICONDUCTOR DEVICE WITH TWO OVERLAPPING DIFFUSION LAYERS HELD AT FLOATING VOLTAGE FOR IMPROVING WITHSTAND VOLTAGE

(75) Inventors: Shuichi Kikuchi, Gunma (JP);
Kiyofumi Nakaya, Saitama (JP);
Shigeaki Okawa, Tochigi (JP)

(73) Assignee: Sanyo Electric Co., Ltd., Osaka (JP)

( * ) Notice: Subject to any disclaimer, the term of this patent is extended or adjusted under 35 U.S.C. 154(b) by 47 days.

(21) Appl. No.: 11/516,733

(22) Filed: Sep. 7, 2006

(65) Prior Publication Data

US 2007/0057321 A1 Mar. 15, 2007

(30) Foreign Application Priority Data

Sep. 12, 2005 (JP) ............................. 2005-263468

(51) Int. Cl.
*H01L 29/00* (2006.01)
(52) U.S. Cl. .................. 257/168; 257/409; 257/509; 257/496; 257/173; 257/328; 257/339; 257/E29.276; 257/E29.023; 257/327; 257/490; 257/492; 257/493; 257/495; 257/E29.012; 257/E29.197; 257/E29.256; 257/E29.258
(58) Field of Classification Search .................. None
See application file for complete search history.

(56) References Cited

U.S. PATENT DOCUMENTS 4,348,600 A * 9/1982 Jarrett et al. .................. 326/79

5,633,521 A 5/1997 Koishikawa
6,642,599 B1 * 11/2003 Watabe et al. ............... 257/509

FOREIGN PATENT DOCUMENTS

| EP | 0 571 027 | 11/1993 |
|---|---|---|
| EP | 0 649 177 | 4/1995 |
| JP | 2000-156495 A | 6/2000 |
| JP | 2005-093696 | 4/2005 |
| JP | 2005-093696 A | 4/2005 |

OTHER PUBLICATIONS

European Search Report mailed May 2, 2008, directed to counterpart EP application No. 06019023.8; 6 pages.

* cited by examiner

*Primary Examiner*—Minh-Loan T Tran
*Assistant Examiner*—Fei Fei Yeung Lopez
(74) *Attorney, Agent, or Firm*—Morrison & Foerster LLP (57) ABSTRACT

In a semiconductor device of the present invention, a MOS transistor is disposed in an elliptical shape. Linear regions in the elliptical shape are respectively used as the active regions, and round regions in the elliptical shape is used respectively as the inactive regions. In each of the inactive regions, a P type diffusion layer is formed to coincide with a round shape. Another P type diffusion layer is formed in a part of one of the inactive regions. These P type diffusion layers are formed as floating diffusion layers, are capacitively coupled to a metal layer on an insulating layer, and assume a state where predetermined potentials are respectively applied thereto. This structure makes it possible to maintain current performance of the active regions, while improving the withstand voltage characteristics in the inactive regions.

11 Claims, 5 Drawing Sheets

SEMICONDUCTOR DEVICE WITH TWO OVERLAPPING DIFFUSION LAYERS HELD AT FLOATING VOLTAGE FOR IMPROVING WITHSTAND VOLTAGE

CROSS-REFERENCE OF THE INVENTION

This application claims priority from Japanese Patent Application No. 2005-263468 filed Sep. 12, 2005, the content of which is incorporated herein by reference in its entirety.

BACKGROUND OF THE INVENTION

1. Field of the Invention

The present invention relates to a semiconductor device of high withstand voltage, which improves withstand voltage characteristics of its inactive region.

2. Description of the Related Art

A conventional semiconductor device, such as an N channel type MOS transistor, is formed in an elliptical shape. The semiconductor device includes an N type drain region disposed in its center region, an N type buffer region disposed circularly surrounding the N type drain region, and an N type drift region disposed circularly surrounding the N type buffer region. The semiconductor device also includes a P type well region disposed surrounding the N type drift region, and an N type source region disposed in each of linear regions of the P type well region. With this structure, it is intended to achieve an improvement in on-state withstand voltage characteristics of the device. This technology is described for instance in Japanese Patent Application Publication No. 2000-156495, pp. 6 and 7, and FIG. 1.

A conventional semiconductor device, such as an N channel type MOS transistor, is formed in an elliptical shape as previously mentioned. The semiconductor device includes a P type semiconductor substrate, a semiconductor layer formed on the P type semiconductor substrate, a P type body region formed on the semiconductor layer, and an N type source region and a P type contact region which are formed in the P type body region. The semiconductor device also includes a drain region formed on the semiconductor layer, and a field oxide film formed between the drain region and the body region. The semiconductor device further includes four P type floating field rings disposed circularly under the field oxide film. This technology is described for instance in Japanese Patent Application Publication No. 2005-93696, pp. 6 and 7, and FIGS. 1 and 2.

As mentioned above, the conventional semiconductor device, specifically the N channel type MOS transistor, is formed in the elliptical shape. The semiconductor device includes the P type well region in a circular form, which is formed in linear regions and round regions to be used as active regions and inactive regions, respectively. The conventional semiconductor device has a problem that it is difficult to achieve desired withstand voltage characteristics, since the inactive regions in particular, with the same structure as that of the linear regions, is prone to convergence of an electric field due to its round shape when the MOS transistor is off.

Moreover, the conventional N channel type MOS transistor includes the four P type floating field rings, which are circularly disposed between the drain region and the body region, in order to improve the withstand voltage characteristics of the round region. With this structure, the conventional MOS transistor has a problem that it is difficult to achieve desired current characteristics, since the P type floating field rings form barriers against the flow of free carriers (electrons) between the drain and source regions and thus lead to an increase in the on-state resistance value.

The conventional semiconductor device includes the field oxide film formed between the drain and source regions, as mentioned above. With this structure, the conventional semiconductor device has a problem that it is difficult to achieve desired current characteristics, since the field oxide film forms a barrier against the flow of free carriers (electrons) between the drain and source regions and thus leads to an increase in the on-state resistance value.

SUMMARY OF THE INVENTION

The invention provides a semiconductor device that includes a semiconductor layer having an active region and an inactive region. The active region has a source region, a drain region and a gate electrode formed therein, and the inactive region has neither a source region, a drain region nor a gate electrode. The device also includes an insulating layer disposed on the semiconductor layer, a first diffusion layer formed in the inactive region so as to be floating, a second diffusion layer formed in the active and inactive regions so as to be floating, and a metal layer disposed on the insulating film so as to form capacitive coupling with the first and second diffusion layers where the first diffusion layer merges with the second diffusion layer.

DETAILED DESCRIPTION OF THE INVENTION

Figure 1:
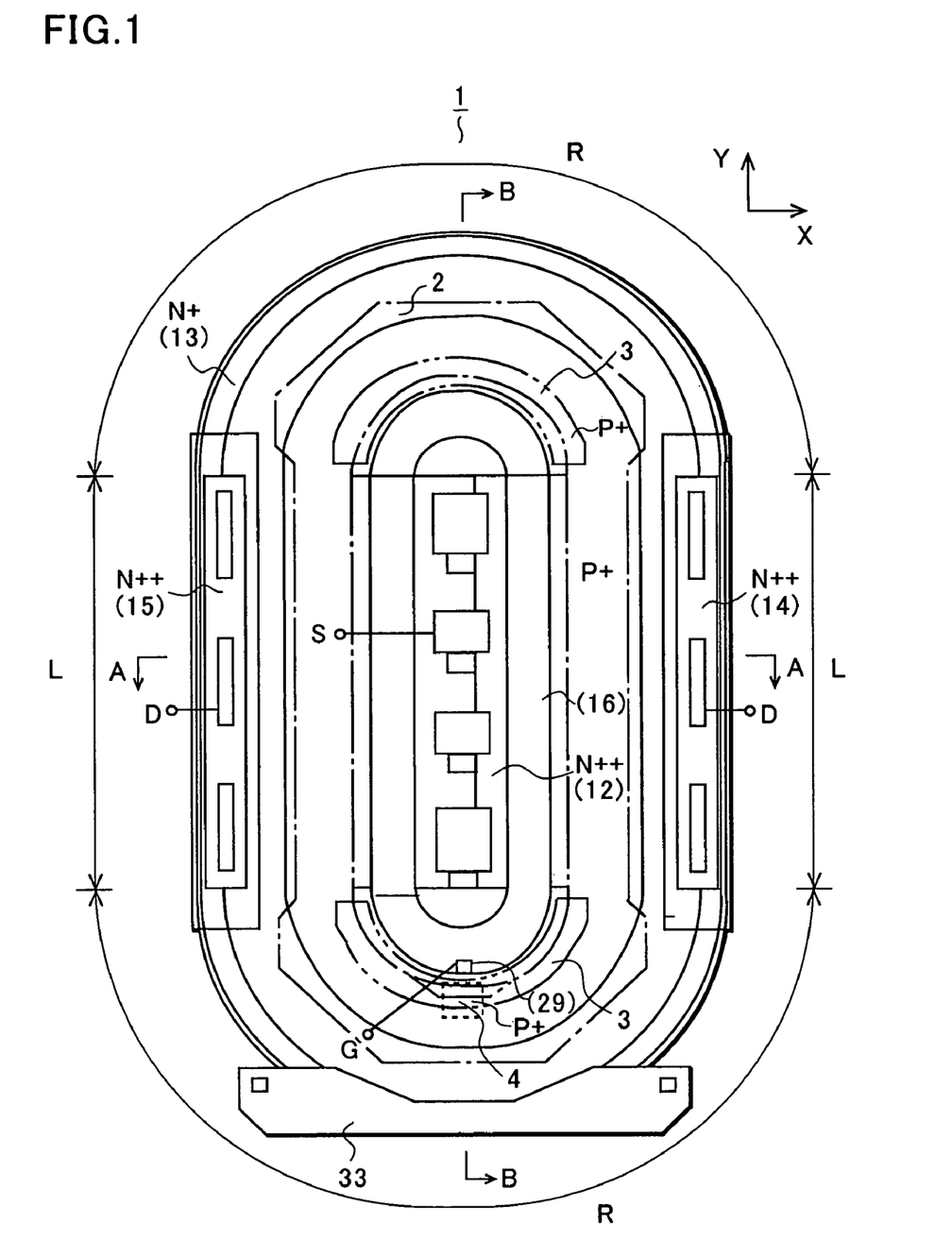
FIG. 1 is a plan view for explaining an N channel type MOS transistor according to an embodiment of the present invention.
Figure 2:
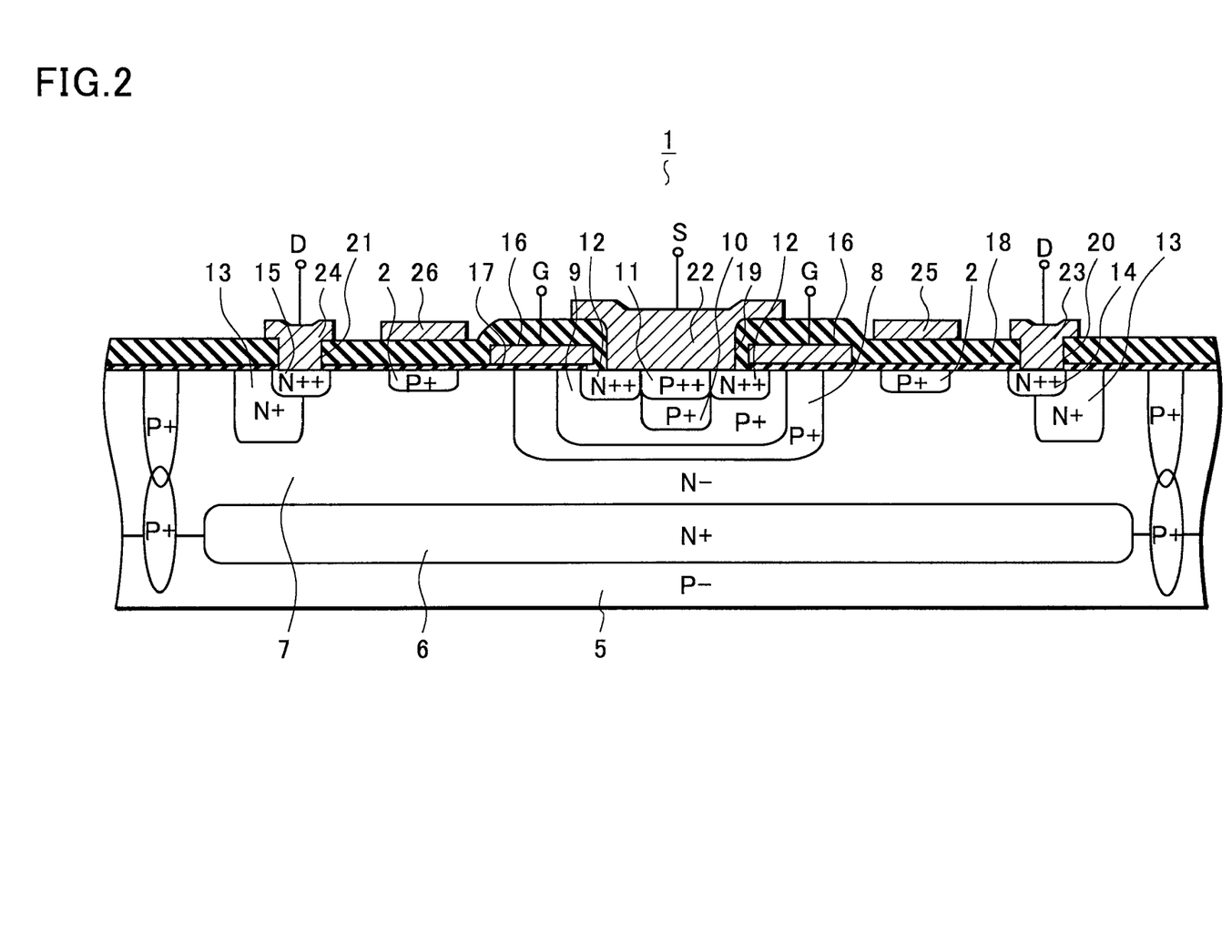
FIG. 2 is a cross-sectional view for explaining the N channel type MOS transistor according to the embodiment of the present invention.
Figure 3:
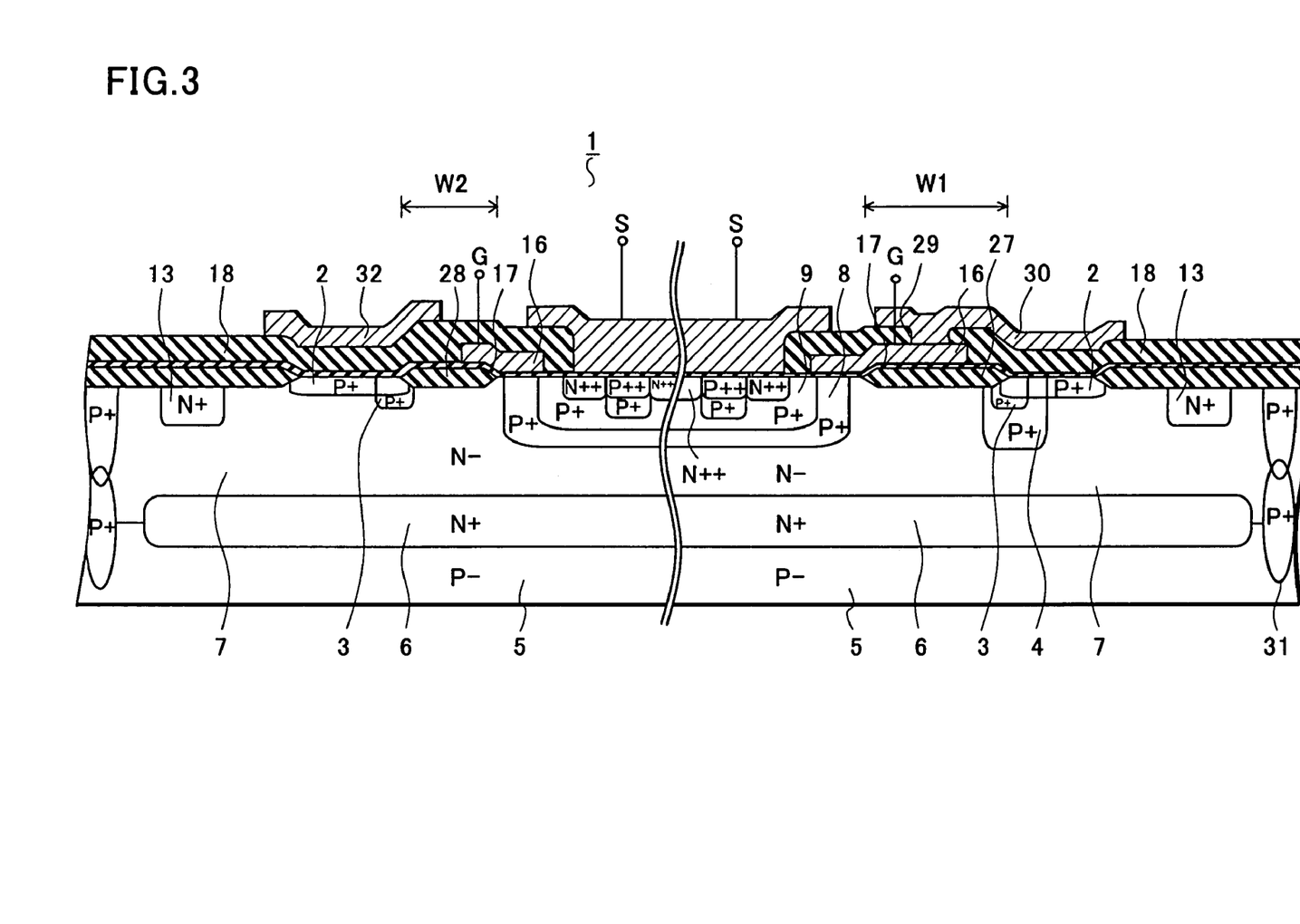
FIG. 3 is a cross-sectional view for explaining the N channel type MOS transistor according to the embodiment of the present invention.
Figure 4A:
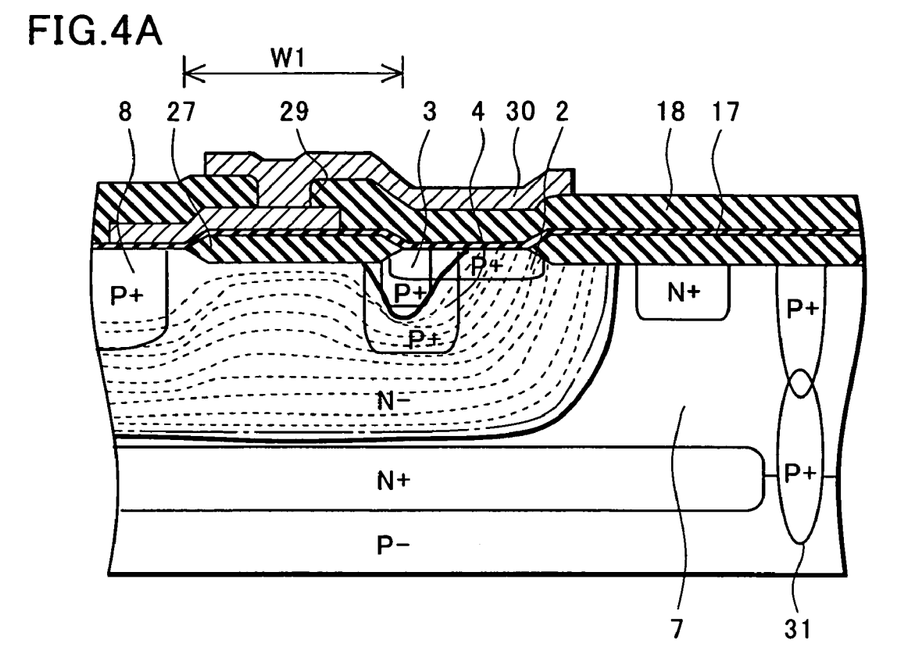
FIG. 4A is a view for explaining the potential distribution in a reverse bias state of the N channel type MOS transistor according to the embodiment of the present invention.
Figure 4B:
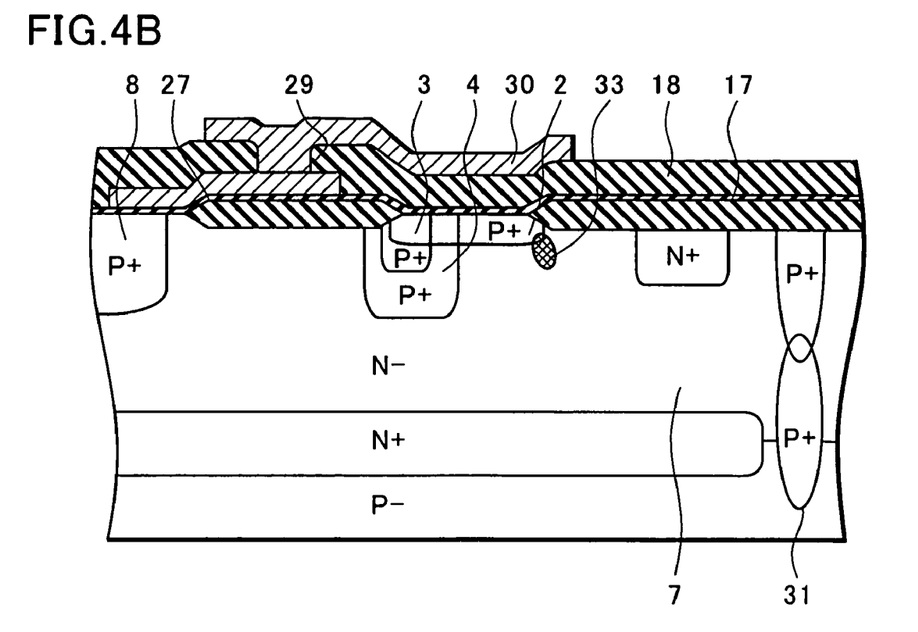
FIG. 4B is a view for explaining an impact ionization region of the N channel type MOS transistor according to the embodiment of the present invention.
Figure 5A:
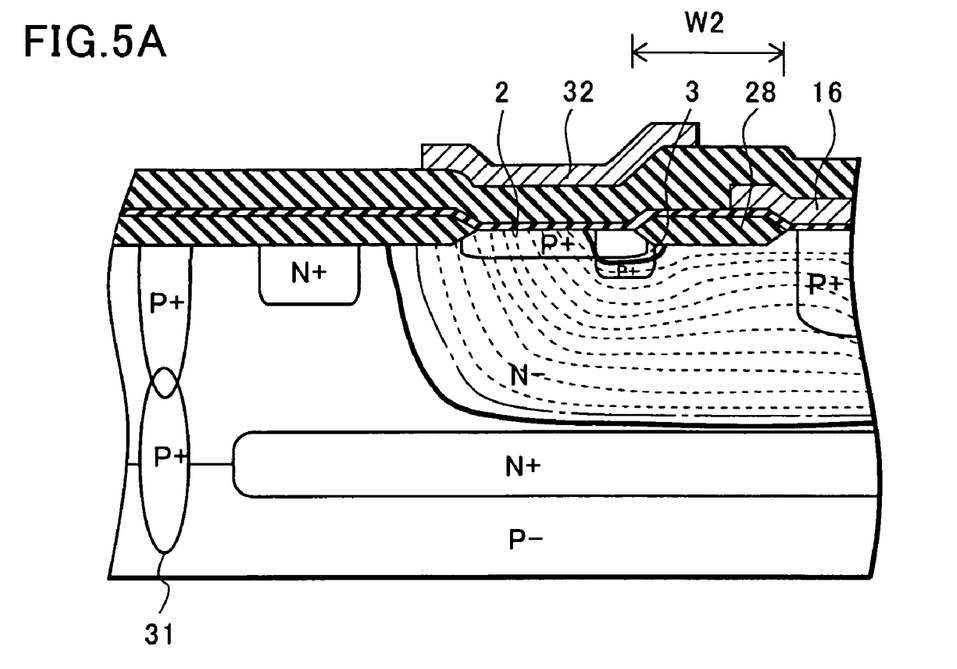
FIG. 5A is a view for explaining the potential distribution in a reverse bias state of the N channel type MOS transistor according to the embodiment of the present invention.
Figure 5B:
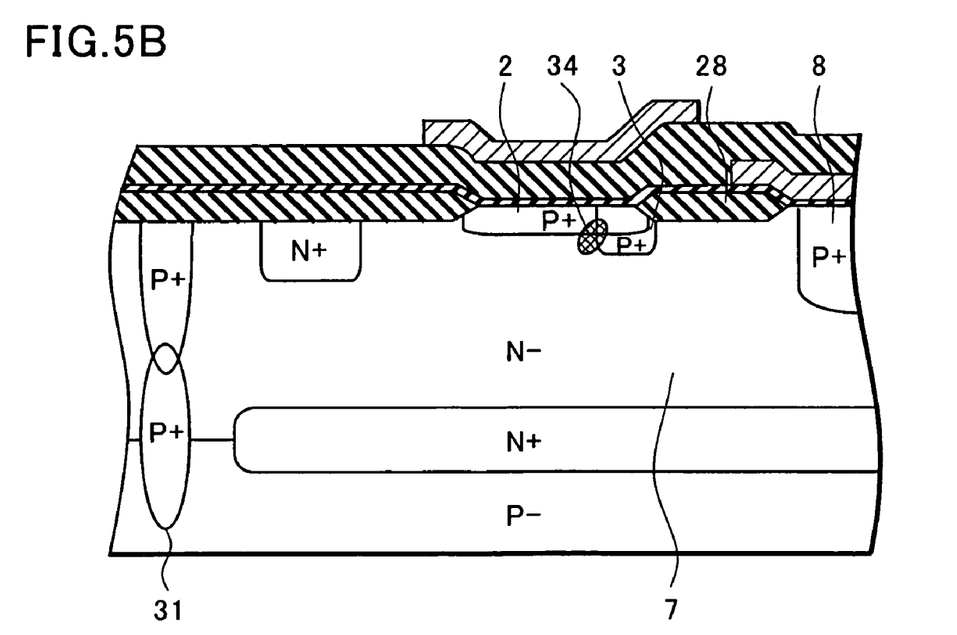
FIG. 5B is a view for explaining the impact ionization region of the N channel type MOS transistor according to the embodiment of the present invention.

A semiconductor device according to one embodiment of the present invention will be described in detail below with reference to FIGS. 1 to 5B. FIG. 1 is a plan view for explaining an N channel type MOS transistor according to the embodiment. FIG. 2 is a cross-sectional view taken along the line A-A of FIG. 1, for explaining the N channel type MOS transistor according to the embodiment. FIG. 3 is a cross-sectional view taken along the line B-B of FIG. 1, for explaining the N channel type MOS transistor according to the embodiment. FIG. 4A is a view for explaining the potential distribution in a reverse state of the N channel type MOS transistor according to the embodiment. FIG. 4B is a view for explaining an impact ionization region of the N channel type MOS transistor according to the embodiment. FIG. 5A is a view for explaining the potential distribution in a reverse bias state of the N channel type MOS transistor according to the embodiment. FIG. 5B is a view for explaining the impact ionization region of the N channel type MOS transistor according to the embodiment.

As shown in FIG. 1, the N channel type MOS transistor 1 is formed in an elliptical shape, for example. Linear regions L in the elliptical shape include a source region disposed in its center region, and drain regions disposed on both sides of the source region. The linear regions L let a current pass between the drain and source regions, i.e., along the x axis. In short, the linear regions L are used as active regions which let the current pass. On the other hand, round regions R in the elliptical shape are used as inactive regions which do not let the current pass. A P type diffusion layer 2 is circularly formed, extending across both the active and inactive regions. The P type diffusion layer 2 is disposed in a region shown by the dash-dot line in FIG. 1, and is disposed between the source and drain regions in the active regions. In the round regions R, P type diffusion layers 3 and 4, respectively shown by the dash-double-dot line and the dotted line in FIG. 1, are formed in order to improve the withstand voltage characteristics in the inactive regions, although the detailed description thereof will be given later with reference to FIGS. 4A to 5B.

Incidentally, the P type diffusion layer 2 in the embodiment corresponds to a "second diffusion layer" of the present invention. The P type diffusion layers 3 in the embodiment correspond to "first diffusion layers" of the present invention. The P type diffusion layer 4 in the embodiment corresponds to a "third diffusion layer" of the present invention. Reference numerals enclosed within parentheses in FIG. 1 correspond to reference numerals given in FIGS. 2 and 3.

As shown in FIG. 2, a cross-section taken along the line A-A of FIG. 1 shows a cross-section of the active region of the MOS transistor 1. The MOS transistor 1 is configured mainly with: the P type diffusion layer 2; a P type single crystal silicon substrate 5; an N type buried diffusion layer 6; an N type epitaxial layer 7; P type diffusion layers 8, 9, 10 and 11 to be used as back gate regions; an N type diffusion layer 12 to be used as the source region; N type diffusion layers 13, 14 and 15 to be used as the drain regions; and a gate electrode 16.

The P type diffusion layer 2 is formed in the epitaxial layer 7. As mentioned above, the P type diffusion layer 2 is circularly formed as surrounding the P type diffusion layer 8 which is used as the back gate region. The P type diffusion layer 2 is formed, for example, under conditions of diffusion where the surface of the P type diffusion layer 2 has an impurity concentration of about $1.0 \times 10^{15}$ to $1.0 \times 10^{16}$ (/cm$^2$) and a diffusion depth of about 1 to 3 (μm). Moreover, the P type diffusion layer 2 is formed as a floating diffusion layer and forms capacitive coupling with metal layers 25 and 26 above the P type diffusion layer 2. When a reverse bias is applied to the MOS transistor 1, this structure causes a state where a certain potential is applied to the P type diffusion layer 2, thereby it is possible to improve the withstand voltage characteristics in the active regions. The P type diffusion layer 2 is designed to have the impurity concentration in consideration of the withstand voltage characteristics and the on-state resistance value, because the on-state resistance value increases when the P type diffusion layer 2 is formed in the active regions.

The N type epitaxial layer 7 is formed above the P type single crystal silicon substrate 5. The N type buried diffusion layer 6 is formed between the substrate 5 and the epitaxial layer 7. The substrate 5 and the epitaxial layer 7 in the embodiment correspond to a "semiconductor layer" of the present invention. Moreover, in this embodiment, although the description is given for a case where the single epitaxial layer 7 is formed on the substrate 5, the present invention is not limited to this case. For example, the "semiconductor layer" of the embodiment of the present invention may be formed of the substrate alone or may be formed of the substrate and a plurality of epitaxial layers deposited thereon. Moreover, the substrate may be formed of an N type single crystal silicon substrate or a compound semiconductor substrate.

The P type diffusion layer 8 is formed in the epitaxial layer 7. The P type diffusion layers 9, 10 and 11 are formed in the P type diffusion layer 8 in such a manner that the diffusion layers 9, 10 and 11 are superposed on the diffusion layer 8. The P type diffusion layer 9 being superposed on the P type diffusion layer 8 achieves reduction in the resistance value of the back gate region and hence achieves prevention of operation of a parasitic NPN transistor.

The N type diffusion layer 12 is formed in the P type diffusion layer 9. The N type diffusion layer 12 is used as the source region. The N type diffusion layer 12 and the P type diffusion layer 11 are connected to source electrodes S and are at the same potential. The P type diffusion layers 10 and 11 are disposed as being surrounded by the N type diffusion layer 12, and are used as back gate lead regions. The P type diffusion layers 10 and 11 are formed as high-concentration impurity regions, thereby making it possible to reduce contact resistance.

The N type diffusion layers 13, 14 and 15 are formed in the epitaxial layer 7. The N type diffusion layers 13, 14 and 15 are used as the drain regions. As shown in FIG. 1, the N type diffusion layer 13 is circularly disposed, extending across both the active and inactive regions. The N type diffusion layers 14 and 15 are disposed in the active regions on both sides of the N type diffusion layer 12 which forms the source region. The P type diffusion layers 8 and 9, which are located under the gate electrode 16 and which are located between the N type diffusion layers 12 and 15, are used as channel regions.

The gate electrode 16 is formed on a top surface of a gate oxide film 17. The gate electrode 16 is made of, for example, a polycide film which is a deposited film formed of a polysilicon film and a tungsten silicide (WSi) film. The gate electrode 16 is formed with a desired film thickness. The gate electrode 16 may be made of a single layer film formed of a polysilicon film, other various single layer films or deposited films, or the like.

An insulating layer 18 is formed on a top surface of the epitaxial layer 7. The insulating layer 18 is made of a BPSG (boron phospho silicate glass) film, an SOG (spin on glass) film, or the like. Heretofore known photolithography technology is used for, for example, dry etching using $CHF_3+O_2$ base gas to form contact holes 19, 20 and 21 in the insulating layer 18.

Metal layers 22, 23 and 24 are buried in the contact holes 19, 20 and 21, respectively. The metal layers 22, 23 and 24 each have a structure formed of, for example, an aluminum-silicon (Al—Si) layer, an aluminum-copper (Al—Cu) layer or an aluminum-silicon-copper (Al—Si—Cu) layer deposited on a barrier metal layer. The metal layers 22, 23 and 24 may be each formed of a barrier metal layer and a metal layer in each of the contact holes 19, 20 and 21. The metal layer made of a high melting point metal such as tungsten (W) is buried in the barrier metal layer. A metal layer composed almost exclusively of aluminum is formed on the metal layer made of the high melting point metal.

The metal layers 25 and 26 are formed on a top surface of the insulating layer 18 to cover the P type diffusion layer 2. The metal layers 25 and 26 are wiring layers, although not shown, connected to the source electrodes S. With this structure, the P type diffusion layer 2 forms capacitive coupling with the metal layers 25 and 26 through the gate oxide film 17, the insulating layer 18, and so on interposed in between. Desired potentials are applied to the P type diffusion layer 2, although the potentials are slightly higher than a source potential. With this structure, the P type diffusion layer 2 is biased in a direction reverse to the N type epitaxial layer 7, thereby improving the withstand voltage characteristics of the MOS transistor 1.

As shown in FIG. 3, a cross-section taken along the line B-B of FIG. 1 shows a cross-section of the inactive regions of the MOS transistor 1. In FIG. 3, omitted is the cross-section of the active regions which are the linear regions L in the elliptical shape, and mainly shown is the cross-section of the inactive regions which are the round regions R in the elliptical shape. The cross-section shown on the right side of the omitted part corresponds to a lower section along the y axis in FIG. 1. The cross-section shown on the left side of the omitted part corresponds to an upper section along the y axis in FIG. 1.

In the round regions R, LOCOS oxide films 27 and 28 are each formed between the P type diffusion layer 8 and the N type diffusion layer 13. The LOCOS oxide films 27 and 28 are each formed only in the inactive regions which are the round regions R, and are not formed in the active regions which are the linear regions L. In the inactive regions, respective ends of the gate electrode 16 are disposed on the LOCOS oxide films 27 or 28. With this structure, in the active regions, the LOCOS oxide films 27 and 28 do not form barriers and it prevents a current from making a detour, and hence to prevent current characteristics from deteriorating. This structure also makes it possible to prevent the on-state resistance value from increasing. On the other hand, in the inactive regions, the LOCOS oxide films 27 and 28 cause the gate electrode 16 to be apart from the surface of the epitaxial layer 7, so that this structure makes it possible to improve the withstand voltage characteristics. The LOCOS oxide films 27 and 28 in the embodiment correspond to "field oxide films" of the present invention.

On the LOCOS oxide film 27, a metal layer 30 is connected to the gate electrode 16 through a contact hole 29 formed in the insulating layer 18. On the insulating layer 18, the metal layer 30 extends toward an isolation region 31 to cover the P type diffusion layer 2. The P type diffusion layer 2 forms capacitive coupling with the metal layer 30 through the gate oxide film 17, the insulating layer 18, and so on interposed in between. On the other hand, near the LOCOS oxide film 28, metal layer 32 is formed as being located above the P type diffusion layer 2. The metal layer 32 is connected to the source electrodes S, and the P type diffusion layer 2 forms capacitive coupling with the metal layer 32 through the gate oxide film 17, the insulating layer 18, and so on interposed in between.

As regards the LOCOS oxide film 27, one of the P type diffusion layers 3 is formed on an end of the LOCOS oxide film 27 and in its vicinity to coincide with the shape of the round regions R, as shown by the dash-double-dot lines in FIG. 1. The corresponding P type diffusion layer 3 is formed as a floating diffusion layer in such a manner that a formation region of the P type diffusion layer 2 and a formation region of the P type diffusion layer 3 are superposed on each other. In addition, as shown by the dotted lines in FIG. 1, the P type diffusion layer 4 is formed to correspond to a region, in a vicinity of the contact hole 29, where a width W1 of the LOCOS oxide film 27 is greater. In the vicinity of the contact hole 29, the width W1 of the LOCOS oxide film 27 is greater than a width W2 of the LOCOS oxide film 28. The reason is that a flat region is required above the LOCOS oxide film 27 in order to connect the metal layer 30 to the gate electrode 16, as mentioned above. Even as regards the LOCOS oxide film 27, the width of the LOCOS oxide film 27 is equal to the width W2 in regions other than the vicinity of the contact hole 29.

The P type diffusion layers 3 and 4 form capacitive coupling with the metal layer 30 on the top surface of the insulating layer 18, as in the case of the P type diffusion layer 2. The P type diffusion layers 3 are formed, for example, under conditions of diffusion where each of the surfaces of the P type diffusion layers 3 has an impurity concentration of about $1.0 \times 10^{17}$ to $1.0 \times 10^{18}$ (/c m$^2$) and a diffusion depth of about 2 to 4 (μm). The P type diffusion layer 4 is formed, for example, under conditions of diffusion where the surface of the P type diffusion layer 4 has an impurity concentration of about $1.0 \times 10^{16}$ to $1.0 \times 10^{17}$ (/c m$^2$) and a diffusion depth of about 5 to 6 (μm).

On the other hand, as regards the LOCOS oxide film 28, one of the P type diffusion layers 3 is formed on an end of the LOCOS oxide film 28 and in its vicinity to coincide with the shape of the round regions R. The corresponding P type diffusion layer 3 is formed as a floating diffusion layer in such a manner that the P type diffusion layer 2 and the P type diffusion layer 3 are superposed on each other. The corresponding P type diffusion layer 3 forms capacitive coupling with the metal layer 32 on the top surface of the insulating layer 18, as in the case of the P type diffusion layer 2.

With this structure, near the LOCOS oxide film 27 in the vicinity of the contact hole 29, a space between the P type diffusion layer 8 and the P type diffusion layer 2 becomes greater, but a total depletion does not occur in a region where at least the P type diffusion layers 2, 3 and 4 are superposed on one another, so that the withstand voltage characteristics can be improved. On the other hand, near the LOCOS oxide film 27 not being in the vicinity of the contact hole 29, or near the LOCOS oxide film 28, a total depletion does not occur in a region where at least the P type diffusion layers 2 and 3 are superposed on each other, so that the withstand voltage characteristics can be improved. As shown in FIG. 1, each of the inactive regions has a structure which is prone to convergence of an electric field due to its round shape. However, the P type diffusion layers 2, 3 and 4 are disposed in one of the inactive regions, so that it is possible to further improve the withstand voltage characteristics in the corresponding inactive region, as compared to the active regions.

Moreover, the P type diffusion layers 3 and 4 are disposed only in the inactive regions and are not disposed in the active regions. The reason is that the active regions are the linear regions whose structure is less prone to convergence of an electric field than the inactive regions. In other words, in the embodiment, the active regions have the structure in which only the P type diffusion layer 2 is disposed, so that the withstand voltage characteristics of the MOS transistor 1 are determined by the withstand voltage characteristics of the active regions. With this structure, the active regions do not have to have P type diffusion layers more than necessary, thus making it possible to prevent an increase in the on-state resistance value of the MOS transistor 1 due to excess P type diffusion layers becoming barriers. This structure also makes it possible to prevent an increase in device size.

In FIG. 4A, there is shown a region, near the LOCOS oxide film 27 in the vicinity of the contact hole 29, where the P type diffusion layer 4 is formed. As shown in FIG. 4A, the bold solid lines show end regions of a depletion layer, the dotted lines show equipotential lines, and the dash-dot line shows an equipotential line at 359 V. As shown in FIG. 4A, although the P type diffusion layers 2, 3 and 4 are formed as the floating diffusion layers, there is a region to which a potential slightly higher than a gate potential is applied. The region where the P type diffusion layers 2, 3 and 4 are superposed on one another is a high-concentration impurity region, and an undepleted region is present as shown by the solid line. The reason is that the undepleted P type diffusion layers 2, 3 and 4 form capacitive coupling with the metal layer 30, as mentioned above.

Moreover, the P type diffusion layer 4 is diffused to the same depth as the depth of the P type diffusion layer 8. A depletion layer, which extends from a boundary between the P type diffusion layer 4 and the epitaxial layer 7, extends over a wide region in a horizontal direction, as in the case of a depletion layer which extends from a boundary between the P type diffusion layer 8 and the epitaxial layer 7. With this structure, the width W1 of the LOCOS oxide film 27 becomes greater in the vicinity of the contact hole 29, but the P type diffusion layers 4 and 8 can prevent deterioration in withstand voltage due to the width W1. In other words, it is possible to avoid a state where convergence of an electric field is prone to occur due to shortened distances between each of the equipotential lines under the LOCOS oxide film 27.

Moreover, the P type diffusion layer 2 is formed as extending toward the isolation region 31. As mentioned above, the region where only the P type diffusion layer 2 is formed is a low-concentration impurity region and is depleted as shown in FIG. 4A. In the region where the P type diffusion layer 2 is formed, distances between each of the equipotential lines change gradually. In other words, the P type diffusion layer 2 totally depleted is disposed outside the outermost periphery of the source region. As shown in FIG. 4A, this structure reduces a change in curvature of the end regions of the depletion layer, thus improving the withstand voltage characteristics of the MOS transistor 1.

Incidentally, as shown by a hatched region 33 in FIG. 4B, impact ionization occurs in a vicinity of an end portion of the P type diffusion layer 2 located near the isolation region 31. As can be also understood from FIG. 4B, the P type diffusion layers 3 and 4 are formed in an end portion of, and a vicinity region of, the LOCOS oxide film 27 in the vicinity of the contact hole 29, thus preventing deterioration in the withstand voltage under the LOCOS oxide film 27 having the width W1.

In FIG. 5A, there is shown a region near the LOCOS oxide film 27 where the P type diffusion layer 4 is not formed, or a region near the LOCOS oxide film 28. As shown in FIG. 5A, a bold solid lines show end regions of the depletion layer, a dotted lines show equipotential lines, and a dash-dot line shows an equipotential line at 344 V. As shown in FIG. 5A, although the P type diffusion layers 2 and 3 are formed as the floating diffusion layers, there is a region to which a potential slightly higher than the source potential is applied. The region where the P type diffusion layers 2 and 3 are superposed on each other is a high-concentration impurity region, and an undepleted region is present as shown by the solid line. The reason is that the undepleted P type diffusion layers 2 and 3 form capacitive coupling with the metal layer 32, as mentioned above.

Except the vicinity region of the contact hole 29, there is no need to consider the region for connecting to the gate electrode 16, it is possible to set the width W2 of the LOCOS oxide film 28 at a minimum width. With this structure, each of the P type diffusion layers 3 is formed as having the diffusion depth which is greater than that of the P type diffusion layer 2 and which is shallower than that of the P type diffusion layer 4, so that it is possible to prevent deterioration in the withstand voltage due to the width W2. In other words, it is possible to avoid a state where convergence of an electric field is prone to occur due to shortened distances between each of the equipotential lines under the LOCOS oxide film 28.

Moreover, the P type diffusion layer 2 is formed as extending toward the isolation region 31. As mentioned above, the region where only the P type diffusion layer 2 is formed is the low-concentration impurity region and is depleted as shown in FIG. 5A. In the region where the P type diffusion layer 2 is formed, distances between each of the equipotential lines change gradually. In other words, the P type diffusion layer 2 totally depleted is disposed outside the outermost periphery of the source region. As shown in FIG. 5A, this structure reduces a change in curvature of the end regions of the depletion layer, thus improving the withstand voltage characteristics of the MOS transistor 1.

As shown by a hatched region 34 in FIG. 5B, impact ionization occurs in a vicinity of a region of intersection of the P type diffusion layers 2 and 3 located near the isolation region 31. As can be also understood from FIG. 5B, deterioration in the withstand voltage of the MOS transistor 1 is prevented in a portion under the LOCOS oxide film 27 where the P type diffusion layer 4 is not formed, or in a portion under the LOCOS oxide film 28.

Finally, although not shown in the cross-sectional view of FIG. 3, a conductive plate 33 (see FIG. 1) having the same potential as that of the epitaxial layer 7 is formed between a device region and an isolation layer near the region where the P type diffusion layer 4 is formed. The conductive plate 33 is made of, for example, the same material as that of the gate electrode or the same material as that of the metal layers. A wiring layer or the like connected to the source electrode or the gate electrode is disposed above the conductive plate 33 with an insulating layer interposed in between. With this structure, the conductive plate 33 shields a depletion layer extending from the device region, and hence has an effect of shielding the wiring layer. Thus, the conductive plate 33 relieves convergence of an electric field in a vicinity of an end portion of the isolation region 31 located under the wiring layer, thus it is possible to improve the withstand voltage characteristics of the MOS transistor 1.

Although the description has been given for the case where the P type diffusion layer 4 is formed only in the region where the LOCOS oxide film 27 has the width W1, the present invention is not limited to this case. For example, the P type diffusion layer 4 may be disposed to coincide with the shape of the round regions R, as in the case of the P type diffusion layers 3. Any change can be made in the design of each of the P type diffusion layers 2, 3 and 4 to be formed as the floating diffusion layers so that the P type diffusion layers 2, 3 and 4 may each have an impurity concentration, a diffusion depth, or the like depending on the withstand voltage characteristics of the MOS transistor 1. In addition to the above, various changes can be made without departing from the gist of the embodiment of the present invention.

In this embodiment, the N channel type MOS transistor is disposed in the elliptical shape, and round regions are used as the inactive regions. P type diffusion layers in the floating state are formed in the epitaxial layer in the inactive regions. This structure makes it possible to improve the withstand voltage characteristics in the inactive regions, and thus makes it possible to improve the withstand voltage characteristics of the MOS transistor.

Moreover, in this embodiment, the P type diffusion layer having a lower impurity concentration is formed on the outermost periphery. This structure makes it possible to reduce the change in curvature of the end regions of the depletion layer, and thus makes it possible to improve the withstand voltage characteristics of the MOS transistor.

Moreover, in this embodiment, the P type diffusion layer having a lower impurity concentration and a shallower diffusion depth is circularly formed. This structure makes it possible to improve the withstand voltage characteristics of the MOS transistor.

Furthermore, in this embodiment, LOCOS oxide films are disposed only in the inactive regions, respectively. With the disposition of the contact hole, the P type diffusion layer having a greater diffusion depth is formed in a region where one of the LOCOS oxide films has a greater width. This structure makes it possible for the depletion layer to extend in the horizontal direction, and thus makes it possible to improve the withstand voltage characteristics of the MOS transistor.

What is claimed is:

1. A semiconductor device comprising:
    a semiconductor layer comprising an active region and an inactive region disposed adjacent the active region in plan view of the semiconductor device, the active region being configured to let currents pass and the inactive region being configured not to let currents pass;
    an insulating layer disposed on the semiconductor layer;
    a first diffusion layer formed only in the inactive region so as to be floating;
    a second diffusion layer formed in the active and inactive regions so as to be floating; and
    a metal layer disposed on the insulating film so as to form capacitive coupling with the first and second diffusion layers where the first diffusion layer merges with the second diffusion layer.

2. The semiconductor device of claim 1, wherein an impurity concentration of the second diffusion layer is lower than an impurity concentration of the first diffusion layer, and an outer edge portion of the second diffusion layer is positioned closer to a corresponding outer edge portion of the inactive region than a corresponding outer edge portion of the first diffusion layer is.

3. The semiconductor device of claim 1, wherein the inactive region is of a semi-circular shape, and the first and second diffusion layers are curved to follow the shape of the inactive region.

4. The semiconductor device of claim 2, wherein the inactive region is of a semi-circular shape, and the first and second diffusion layers are curved to follow the shape of the inactive region.

5. The semiconductor device of claim 1, further comprising a field oxide formed in the inactive region so as to be positioned under a contact hole formed in the insulating layer, and a third diffusion layer formed in the inactive region and near the contact hole so as to be floating, wherein the metal layer forms capacitive coupling with the second and third diffusion layers where the second diffusion layer merges with the third diffusion layer.

6. The semiconductor device of claim 5, wherein an impurity concentration of the second diffusion layer is lower than an impurity concentration of the third diffusion layer, and an outer edge portion of the second diffusion layer is positioned closer to a corresponding outer edge portion of the inactive region than a corresponding outer edge portion of the third diffusion layer is.

7. The semiconductor device of claim 5, wherein a diffusion depth of the third diffusion layer is greater than a diffusion depth of the first diffusion layer.

8. The semiconductor device of claim 5, wherein the first, second and third diffusion layers are superposed on one another.

9. The semiconductor device of claim 5, wherein the metal layer forms capacitive coupling with an overlapping region among the first, second and third diffusion layers.

10. The semiconductor device of claim 1, further comprising a source region formed in the semiconductor layer and a drain region formed in the semiconductor layer to surround the source region, wherein the second diffusion layer is disposed between the source region and the drain region.

11. The semiconductor device of claim 1, wherein the drain region has an elongated shape, and the inactive region is disposed at one end of the elongated shape.

* * * * *